(12) United States Patent
Hutton et al.

(10) Patent No.: US 9,588,176 B1
(45) Date of Patent: Mar. 7, 2017

(54) TECHNIQUES FOR USING SCAN STORAGE CIRCUITS

(71) Applicant: Altera Corporation, San Jose, CA (US)

(72) Inventors: Michael Hutton, Mountain View, CA (US); Sean Atsatt, Santa Cruz, CA (US); James Ball, Scotts Valley, CA (US); Dana How, Palo Alto, CA (US); Jeffrey Chromczak, Brownsville (CA); Eng Ling Ho, Simpang Ampat (MY)

(73) Assignee: Altera Corporation, San Jose, CA (US)

( * ) Notice: Subject to any disclaimer, the term of this patent is extended or adjusted under 35 U.S.C. 154(b) by 8 days.

(21) Appl. No.: 14/610,341

(22) Filed: Jan. 30, 2015

(51) Int. Cl.
*G01R 31/28* (2006.01)
*G01R 31/3177* (2006.01)

(52) U.S. Cl.
CPC ............................... *G01R 31/3177* (2013.01)

(58) Field of Classification Search
CPC .................................................. G01R 31/3177
See application file for complete search history.

(56) References Cited

U.S. PATENT DOCUMENTS

| | | | |
|---|---|---|---|
| 5,036,473 A | 7/1991 | Butts et al. | |
| 5,448,496 A | 9/1995 | Butts et al. | |
| 6,240,376 B1 | 5/2001 | Raynaud et al. | |
| 6,336,087 B2 | 1/2002 | Burgun et al. | |
| 6,480,019 B2 | 11/2002 | Waldie et al. | |
| 6,510,534 B1* | 1/2003 | Nadeau-Dostie | G01R 31/318552 714/724 |
| 6,850,880 B1 | 2/2005 | Beausoleil et al. | |
| 7,078,929 B1 | 7/2006 | Draper et al. | |
| 8,689,068 B2 | 4/2014 | Jain et al. | |
| 2006/0236179 A1* | 10/2006 | Ushikubo | G01R 31/31858 714/726 |
| 2008/0092002 A1* | 4/2008 | Shimooka | G01R 31/318536 714/731 |
| 2008/0255780 A1* | 10/2008 | Waayers | G01R 31/318536 702/58 |
| 2009/0089637 A1* | 4/2009 | Jun | G01R 31/318541 714/729 |

(Continued)

OTHER PUBLICATIONS

Michael Hutton, U.S. Appl. No. 14/611,031 entited "Circuit Design Instrumentation for State Visualization," filed Jan. 30, 2015.

*Primary Examiner* — April Y Blair
*Assistant Examiner* — Thien D Nguyen

(57) ABSTRACT

An integrated circuit may include user storage circuits and scan storage circuits. The scan storage circuits may store data from the user storage circuits and provide the data to a user interface during a read-back operation. The user storage circuits may store data from the scan storage circuits, which the scan storage circuits may have received from the user interface during a write-back operation. The scan storage circuits may be arranged in a scan chain and controlled by a local control circuit. The integrated circuit may include multiple local control circuits that each control a sector of the integrated circuit. The local control circuits may communicate with a global control circuit over a communication network, and the global control circuit may communicate with the user interface.

31 Claims, 8 Drawing Sheets

(56) References Cited

U.S. PATENT DOCUMENTS

2009/0187801 A1* 7/2009 Pandey .......... G01R 31/318558
            714/729
2010/0180169 A1* 7/2010 La Fever ....... G01R 31/318536
            714/727

* cited by examiner

TECHNIQUES FOR USING SCAN STORAGE CIRCUITS

CROSS-REFERENCE TO RELATED APPLICATION

This application is related to the U.S. patent application having Ser. No. 14/611,031 entitled "Circuit Design Instrumentation For State Visualization" and filed concurrently herewith, which is incorporated by reference herein in its entirety.

TECHNICAL FIELD

The embodiments presented herein relate to electronic circuits and, more particularly, to techniques for using scan storage circuits.

BACKGROUND

Every transition from one technology node to the next technology node has led to more complex circuit design implementations in integrated circuits. Smaller transistor geometries have allowed potentially more functionality implemented per unit of integrated circuit area. At the same time, the costs of developing and manufacturing integrated circuits have also increased with every technology node. Therefore, integrated circuit developers want to verify that a gate-level representation of a circuit design behaves as defined in the design specification before manufacturing the integrated circuit. The goal is to locate and fix errors in the gate-level representation of the circuit design early such that expensive re-spins can be avoided or at least kept to a minimum.

Gate-level timing simulation has traditionally been used to perform this verification step. Gate-level timing simulation uses a test bench together with a software model of the circuit design to generate output responses to different input vectors. The test bench then compares these output responses with expected results. However, the execution time of gate-level timing simulation often exceeds any practical durations, especially for very big circuit designs that can include billions of gates. Hardware emulation or prototyping of circuit designs have emerged as a faster, more practical alternative to simulation.

Configurable integrated circuits such as programmable integrated circuits are often used as a platform for performing hardware emulation or prototyping of circuit designs. For this purpose, a circuit design description is compiled and implemented on one or more configurable integrated circuits and the test bench is executed on the one or more configurable integrated circuits. Verifying the gate-level representation of a circuit design using hardware emulation reduces execution time by several orders of magnitude compared to gate-level timing simulations.

SUMMARY

According to some embodiments, an integrated circuit may include first and second user storage circuits, a scan chain with first and second scan storage circuits, and first and second multiplexers. The first multiplexer provides a first user signal from the first user storage circuit to the first scan storage circuit in a first mode and provides a first scan signal to the first scan storage circuit in a second mode. The second multiplexer provides a second user signal from the second user storage circuit to the second scan storage circuit in the first mode and provides a second scan signal from the first scan storage circuit to the second scan storage circuit in the second mode.

It should be appreciated that the present invention can be implemented in numerous ways, such as a process, an apparatus, a system, a device, or a method on a computer readable medium. Several embodiments of the present invention are disclosed herein.

In certain embodiments, the above-mentioned integrated circuit may include a clock distribution network and an enable circuit. The clock distribution network is coupled to the first and second user storage circuits and carries a clock signal with a predetermined clock frequency. The enable circuit is coupled between the clock distribution network and the first and second user storage circuits and receives an enable signal that gates the clock signal.

If desired, the integrated circuit may further include an additional clock distribution network coupled to the first and second scan storage circuits. The additional clock distribution network may carry an additional clock signal with an additional predetermined clock frequency that is different than the predetermined clock frequency. The integrated circuit may also include an additional enable circuit coupled between the additional clock distribution network and the first and second scan storage circuits. The additional enable circuit may receive an additional enable signal that gates the additional clock signal.

Further features of the present invention, its nature and various advantages, will be more apparent from the accompanying drawings and the following detailed description of the preferred embodiments.

DETAILED DESCRIPTION

Hardware emulation or prototyping of a circuit design often use a test bench together with a hardware implementation of the circuit design. Configurable integrated circuits such as programmable integrated circuits are often used as a platform for performing hardware emulation or prototyping of circuit designs. For this purpose, a circuit design description may be compiled and implemented in one or more configurable integrated circuits. A test bench may be executed on those configurable integrated circuits to generate output responses to different input vectors. The test bench may then compare these output responses with expected results.

For debugging purposes (e.g., to localize the source of an error), the execution of the test bench on the configured integrated circuits may be interrupted. Then, a read-back operation may extract the state of the synchronous elements (i.e., the data stored in storage circuits such as registers, latches, memories, etc.) through debug ports such as the Internal Configuration Access Port (ICAP) or the Joint Test Action Group (JTAG) ports for further analysis.

However, neither ICAP nor JTAG ports are able to handle the read-back operation at high rates, which may lead to significant delays when the data stored in the storage circuits needs to be retrieved frequently for a design having billions of gates. Traditional configurable integrated circuits also lack a filtering ability during the read-back operation. Thus, a significant amount of unnecessary data is regularly extracted through those ports from the configurable integrated circuits. Therefore, probing only selected storage circuits and/or filtering the data that is retrieved from storage circuits before sending the data off-chip may be desirable.

In some applications, it may also be desirable to halt the clocking of user storage circuits during read-back operations, to perform a non-destructive read-back operation in which the state of the user storage circuits remains unchanged, or to put the user storage circuits in a predetermined state using write operations in a write-back operation.

It will be recognized by one skilled in the art, that the present exemplary embodiments may be practiced without some or all of these specific details. In other instances, well-known operations have not been described in detail in order not to unnecessarily obscure the present embodiments.

Figure 1:
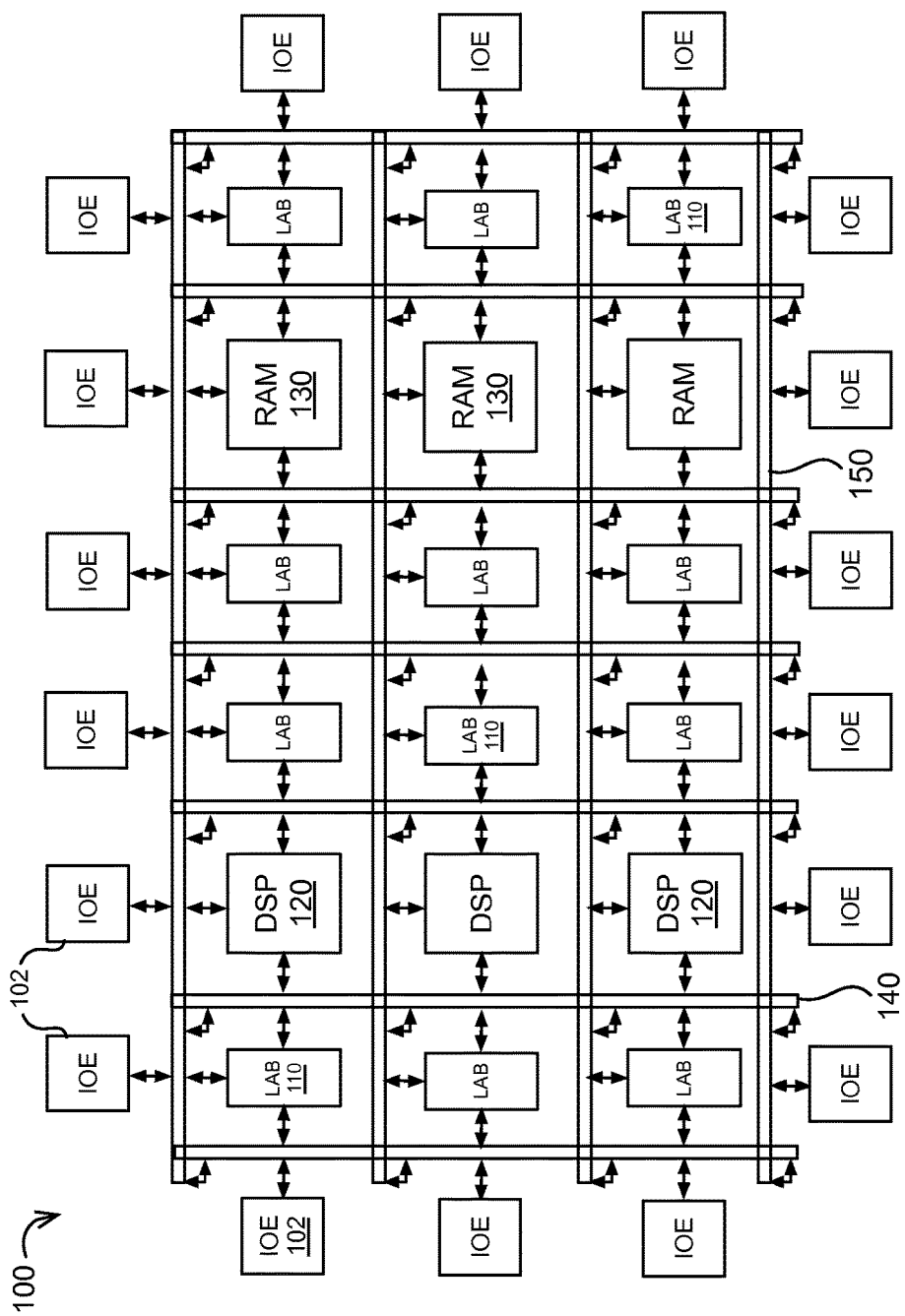
FIG. 1 is a diagram of an illustrative integrated circuit having an exemplary routing topology in accordance with an embodiment.

An illustrative embodiment of an integrated circuit such as programmable integrated circuit 100 that may be configured to implement a circuit design is shown in FIG. 1. As shown in FIG. 1, the programmable integrated circuit 100 may include a two-dimensional array of functional blocks, including logic array blocks (LABs) 110 and other functional blocks, such as random access memory (RAM) blocks 130 and digital signal processing (DSP) blocks 120, for example. Functional blocks such as LABs 110 may include smaller programmable regions (e.g., logic elements, configurable logic blocks, or adaptive logic modules) that receive input signals and perform custom functions on the input signals to produce output signals.

In addition, the programmable integrated circuit 100 may have input/output elements (IOEs) 102 for driving signals off of programmable integrated circuit 100 and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip. If desired, the programmable integrated circuit 100 may have input/output elements 102 arranged in different ways. For example, input/output elements 102 may form one or more columns of input/output elements that may be located anywhere on the programmable integrated circuit 100 (e.g., distributed evenly across the width of the programmable integrated circuit). If desired, input/output elements 102 may form one or more rows of input/output elements (e.g., distributed across the height of the programmable integrated circuit). Alternatively, input/output elements 102 may form islands of input/output elements that may be distributed over the surface of the programmable integrated circuit 100 or clustered in selected areas.

The programmable integrated circuit 100 may also include programmable interconnect circuitry in the form of vertical routing channels 140 (i.e., interconnects formed along a vertical axis of programmable integrated circuit 100) and horizontal routing channels 150 (i.e., interconnects formed along a horizontal axis of programmable integrated circuit 100), each routing channel including at least one track to route at least one wire.

Note that other routing topologies, besides the topology of the interconnect circuitry depicted in FIG. 1, are intended to be included within the scope of the present invention. For example, the routing topology may include wires that travel diagonally or that travel horizontally and vertically along different parts of their extent as well as wires that are perpendicular to the device plane in the case of three dimensional integrated circuits, and the driver of a wire may be located at a different point than one end of a wire. The routing topology may include global wires that span substantially all of programmable integrated circuit 100, fractional global wires such as wires that span part of programmable integrated circuit 100, staggered wires of a particular length, smaller local wires, or any other suitable interconnection resource arrangement.

Furthermore, it should be understood that embodiments may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Programmable integrated circuit 100 may contain programmable memory elements. Memory elements may be loaded with configuration data (also called programming data) using input/output elements (IOEs) 102. Once loaded, the memory elements each provide a corresponding static control signal that controls the operation of an associated functional block (e.g., LABs 110, DSP 120, RAM 130, or input/output elements 102).

In a typical scenario, the outputs of the loaded memory elements are applied to the gates of metal-oxide-semiconductor transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because the memory elements are loaded with configuration data during programming, the memory elements are sometimes referred to as configuration memory, configuration RAM (CRAM), or programmable memory elements.

The programmable memory elements may be organized in a configuration memory array consisting of rows and columns. A data register that spans across all columns and an address register that spans across all rows may receive configuration data. The configuration data may be shifted onto the data register. When the appropriate address register is asserted, the data register writes the configuration data to the configuration memory bits of the row that was designated by the address register.

In certain embodiments, programmable integrated circuit 100 may include configuration memory that is organized in sectors, whereby a sector may include the configuration RAM bits that specify the function and/or interconnections of the subcomponents and wires in or crossing that sector. Each sector may include separate data and address registers.

Figure 2:
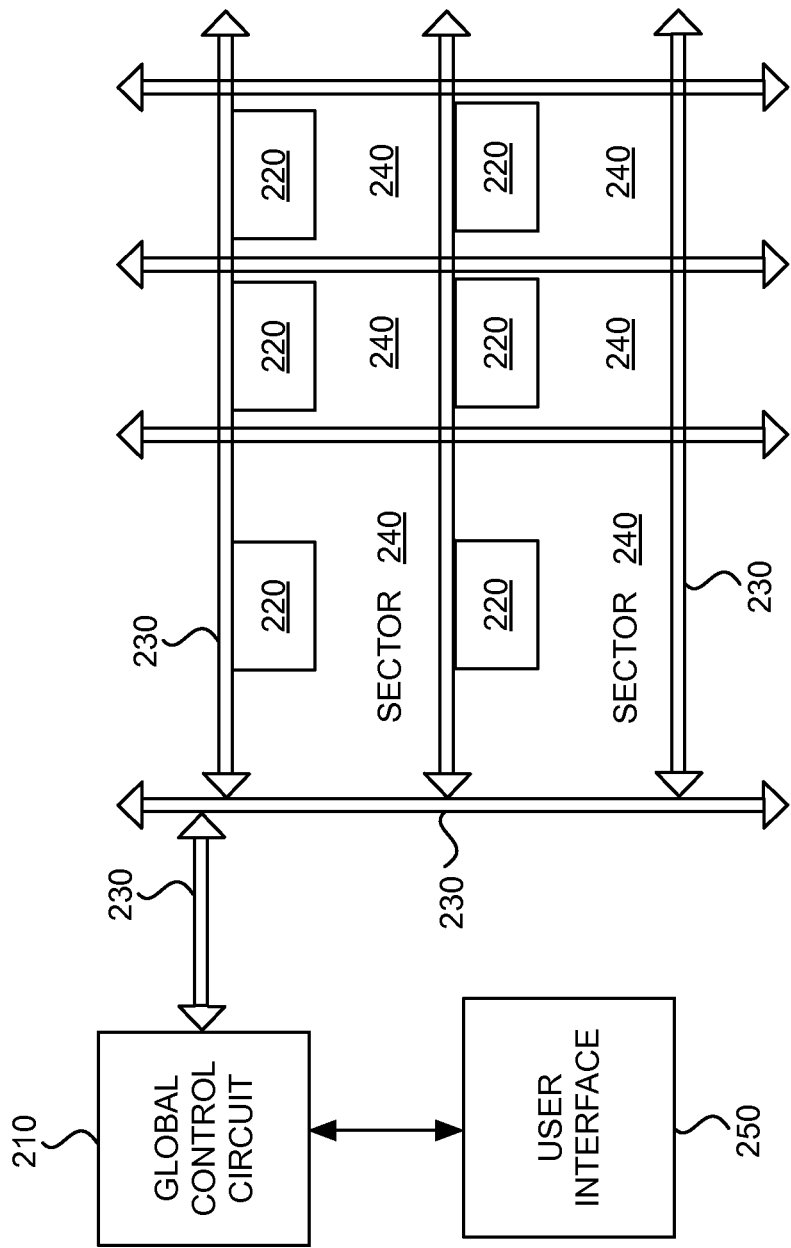
FIG. 2 is a diagram of an illustrative hardware emulation system with a user interface and a global control circuit that controls multiple sectors over a network in accordance with an embodiment.

FIG. 2 shows an illustrative configurable integrated circuit such as programmable integrated circuit 100 with configuration memory that is organized in sectors 240. Each sector 240 may include a local control circuit 220. These local control circuits may control the clock distribution networks and the configuration of the respective sectors 240. If desired, local control circuits 220 may manipulate and observe scan chains inside the respective sectors 240.

In certain embodiments, the local control circuits 220 may be implemented as state machines. In certain embodiments, the local control circuits 220 may be implemented as minimal processors. Each operation supported by local control circuits 220 may be implemented as a separate routine in a memory containing a control program.

In certain embodiments, this control program memory may receive and store new routines in order to implement new operations and functionality into the sectors. These new operations may increase the local activity within the sector. Without this extensibility, new functionality may need to be implemented in terms of pre-existing operations, which may increase the needed amount of communication between the global and local control circuits and prevent fully parallel use of the local control circuits 220.

Communication network 230 may connect local control circuits 220 to a global control circuit 210. If desired, communication network 230 may be implemented as a mesh-based network-on-chip (NoC). Further information on Networks-on-Chip and FPGAs can be found in commonly-owned U.S. Patent Application Publication No. 2014/0126572, "Programmable Logic Device with Integrated Network-on-Chip," which is hereby incorporated by reference herein in its entirety.

Global control circuit 210 may connect to device pins through which it can communicate with user interface 250. User interface 250 may include, for example, a JTAG scan chain, input/output ports, programmable logic circuits, or any combination of these circuits. Global control circuit 210 may receive commands from user interface 250, process the received commands, and send the processed commands to local control circuits 220 as required. In response to receiving commands from global control circuit 210, the local control circuits 220 may orchestrate the reading of the storage circuits in the respective sectors 240 and then send the retrieved data back over communication network 230 to global control circuit 210.

Because global control circuit 210 is responsible for, among other things, coordinating the operations of the local control circuits 220, for communication between user interface 250 and the local control circuits 220, and for security features, global control circuit 210 (or at least a portion thereof) may be implemented in a processor as well. The processor may be a dedicated processor, special boot-up code for a user-visible processor already included in the device's design, or another suitable arrangement.

An advantage of the division into sectors may be that the local control circuits 220 may operate independently and in parallel. Each local control circuit 220 may retrieve data from its respective sector 240 using one or more scan chains in its respective sector 240, as disclosed in further detail below. In some embodiments, each of local control circuits 220 can filter the data retrieved from its respective sector 240 to a reduced set of data after discarding unneeded data. The local control circuits 220 may then transmit the reduced sets of data over communication network 230 to global control circuit 210. If each local control circuit 220 transmits data over communication network 230 at less than the maximum bandwidth of network 230, global control circuit 210 may determine a schedule for the local control circuits 220 to interleave data that is transmitted over network 230. Alternatively, global control circuit 210 may offer a timing schedule that allows the local control circuits 220 to transmit data over network 230 serially at the full bandwidth of network 230.

Global control circuit 210 may communicate with user interface 250 at a high data rate (e.g., through a high-speed serial interface (HSSI) transceiver circuit for example using the 10 Gigabit Ethernet protocol or the Peripheral Component Interconnect Express (PCIe) protocol, to name a few). Global control circuit 210 may communicate with the local control circuits 220 through a time-multiplexed communication network 230, for example, with each of the local control circuits 220 operating at a comparably lower rate but in parallel.

Each of the local control circuits 220 can monitor a first set of storage circuits in its respective sector 240 during a first time period, and a second set of storage circuits in its respective sector 240 during a second time period. The local control circuit's control program may be dynamically extended to perform this monitoring function. This monitoring function would allow the set of storage circuits monitored at some point in time to be much larger than the number of bits sent from the sector over communication network 230 and global control circuit 210 to user interface 250 for external monitoring and interpretation. In addition, fixing a bug in a circuit design that requires altering the design implementation on the configurable integrated circuit (e.g., changing a logic AND to a logic OR) may require a local change that can be brought about using partial reconfiguration of the sector.

Figure 3:
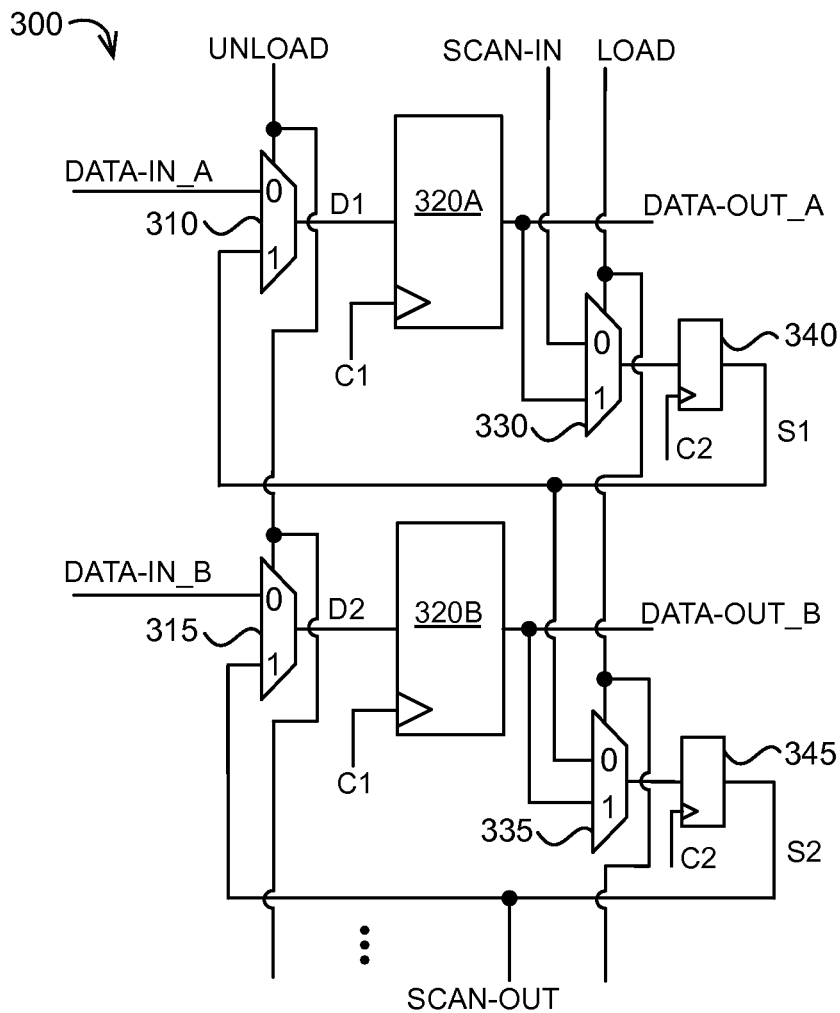
FIG. 3 is a diagram of an illustrative circuit that enables state capturing of user storage circuits using a scan chain in accordance with an embodiment.
Figure 3:
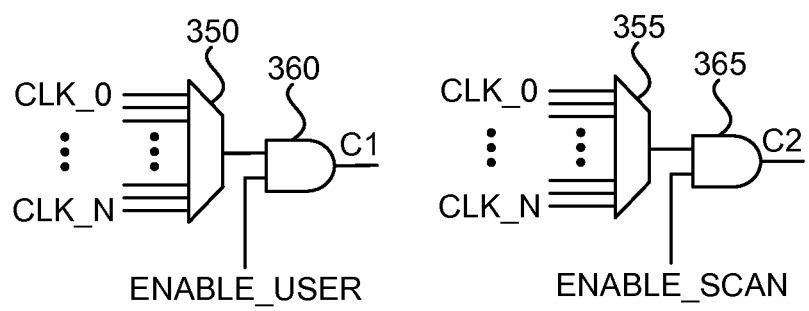

The independence of the sectors 240 may also result in shorter scan chains that are entirely contained within one sector and controlled by the respective local control circuit 220. In certain embodiments, the information about the state of user storage circuits may be retrieved using scan chains. FIG. 3 shows an illustrative circuit 300 that enables state capturing and state restoration of user storage circuits (e.g., user registers) using scan storage circuits (e.g., scan registers) that are arranged in a scan chain.

As shown in FIG. 3, the scan chain includes scan storage circuit 340 and scan storage circuit 345. Multiplexers 330 and 335 couple together scan storage circuits 340 and 345 as a shift register in the scan chain when signal LOAD is '0.' The scan chain that includes scan storage circuits 340 and 345 is a dedicated scan chain that is used to capture and shift out data stored in user storage circuits 320A-320B without shifting additional data into user storage circuits 320A-320B. Thus, the scan chain that includes scan storage circuits 340 and 345 can perform a non-destructive capture of the data stored in user storage circuits 320A-320B without disturbing or erasing the data stored in user storage circuits 320A-320B. Non-destructive capture of data stored in user storage circuits is also referred to as a snapshot.

A clock distribution network may use multiplexer 355 to select a clock signal among clock signals CLK_0, CLK_1, . . . CLK_N. Logic AND gate 365 may receive the clock signal from multiplexer 355 and signal ENABLE_SCAN, which may enable or disable the clock signal. As an example, the output of logic AND gate 365 may be clock signal C2, which may trigger scan storage circuits 340 and 345.

Another clock distribution network may use multiplexer 350 to select a clock signal among clock signals CLK_0, CLK_1, . . . CLK_N. Logic AND gate 360 may receive the clock signal from multiplexer 350 and signal ENABLE_USER, which may enable or disable the clock signal. As an example, the output of logic AND gate 360 may be clock signal C1, which may trigger user storage circuits 320A and 320B.

In design execution mode, which is sometimes also referred to as user mode, user storage circuits 320A and 320B may receive data signals D1 and D2 from multiplexers 310 and 315, respectively. In this mode, signal UNLOAD may be de-asserted, and multiplexers 310 and 315 may select signals DATA-IN_A and DATA-IN_B as signals D1 and D2, respectively. User storage circuits 320A and 320B may store signals D1 and D2 at triggering events (e.g., rising edge, falling edge, high-level, low-level, or any combination thereof) of clock signal C1, and may provide the values of signals D1 and D2 as signals DATA-OUT_A and DATA-OUT_B, respectively.

If desired, a snapshot of the signals stored in user storage circuits 320A and 320B may be retrieved using the scan chain in data retrieval mode. Retrieving the signals stored in user storage circuits 320A and 320B is sometimes also referred to as operating circuit 300 in read-back mode. For this purpose, signals ENABLE_USER and ENABLE_SCAN may be de-asserted to halt clock signals C1 and C2, respectively. Signal LOAD may be set to '1' such that multiplexers 330 and 335 select the signals from user storage circuits 320A and 320B, respectively.

Signal ENABLE_SCAN may be asserted to allow one triggering event of clock signal C2. The one triggering event of clock signal C2 triggers scan storage circuits 340 and 345 to store the values stored in user storage circuits 320A and 320B, respectively. Then, signal LOAD may be switched from '1' to '0' to cause multiplexers 330 and 335 to select signals from other scan storage circuits on the scan chain. For example, multiplexer 335 selects the output signal S1 of scan storage circuit 340. Signal ENABLE_SCAN may then be asserted to start oscillations in clock signal C2. Scan storage circuits 340 and 345 then shift the stored data indicated by signals S1 and S2 out of the scan chain in signal SCAN-OUT at successive triggering events of clock signal C2.

If desired, signal ENABLE_USER may be asserted to start oscillations in clock signal C1. In response to oscillations in clock signal C1, user storage circuits 320A and 320B may operate in design execution mode, while the stored data are retrieved using the scan chain.

In an embodiment, the scan chain of FIG. 3 does not have direct connections to global routing conductors used to route signals between programmable logic blocks in the integrated circuit. Taking a snapshot of the data stored in the user storage circuits 320A-320B using the dedicated scan chain of FIG. 3 may allow for the removal of a global freeze signal and freeze logic that otherwise would be used to gate the global routing conductors.

In another embodiment, global control circuit 210 or the local control circuits 220 may have security logic that can disable read-back mode. The security logic can cause one or more of sectors 240 to enter a secure mode in which the ability of the scan chains in the respective sectors 240 to take snapshots of the data stored in the user storage circuits is disabled. The security logic can be used to ensure that the states of the user storage circuits that are programmed to be secure cannot be accessed in user mode. The security logic may, for example, be controlled by CRAM settings or fuses.

In another scenario, predetermined data may be written to user storage circuits 320A and 320B using the scan chain in data restoration mode. Writing predetermined data to user storage circuits 320A and 320B is sometimes also referred to as operating circuit 300 in write-back mode. For this purpose, signal LOAD may be set to '0' to cause multiplexers 330 and 335 to select signals from other scan storage circuits on the scan chain. Signal ENABLE_SCAN may be asserted to cause the predetermined data to be shifted into the scan chain via signal SCAN-IN. Scan storage circuits 340 and 345 store the predetermined data at their outputs as signals S1 and S2, respectively, in response to successive clock triggering events of clock signal C2.

Next, signals ENABLE_USER and ENABLE_SCAN may be de-asserted to halt clock signals C1 and C2, respectively. Signal UNLOAD may be set to '1' to cause multiplexers 310 and 315 to select the signals S1 and S2 from scan storage circuits 340 and 345 as signals D1 and D2, respectively.

Signal ENABLE_USER may be asserted for one triggering event of clock signal C1. The one triggering event of clock signal C1 may trigger user storage circuits 320A and 320B to store signals D1 and D2, respectively. As a result, user storage circuits 320A and 320B store the predetermined data from scan storage circuits 340 and 345, respectively. Then, signal UNLOAD may be set to '0' to cause multiplexers 310 and 315 to select signals DATA-IN_A and DATA-IN_B as signals D1 and D2, respectively. Signal ENABLE_USER may then be asserted to start clock signal C1, causing user storage circuits 320A and 320B to operate in design execution mode.

Figure 4:
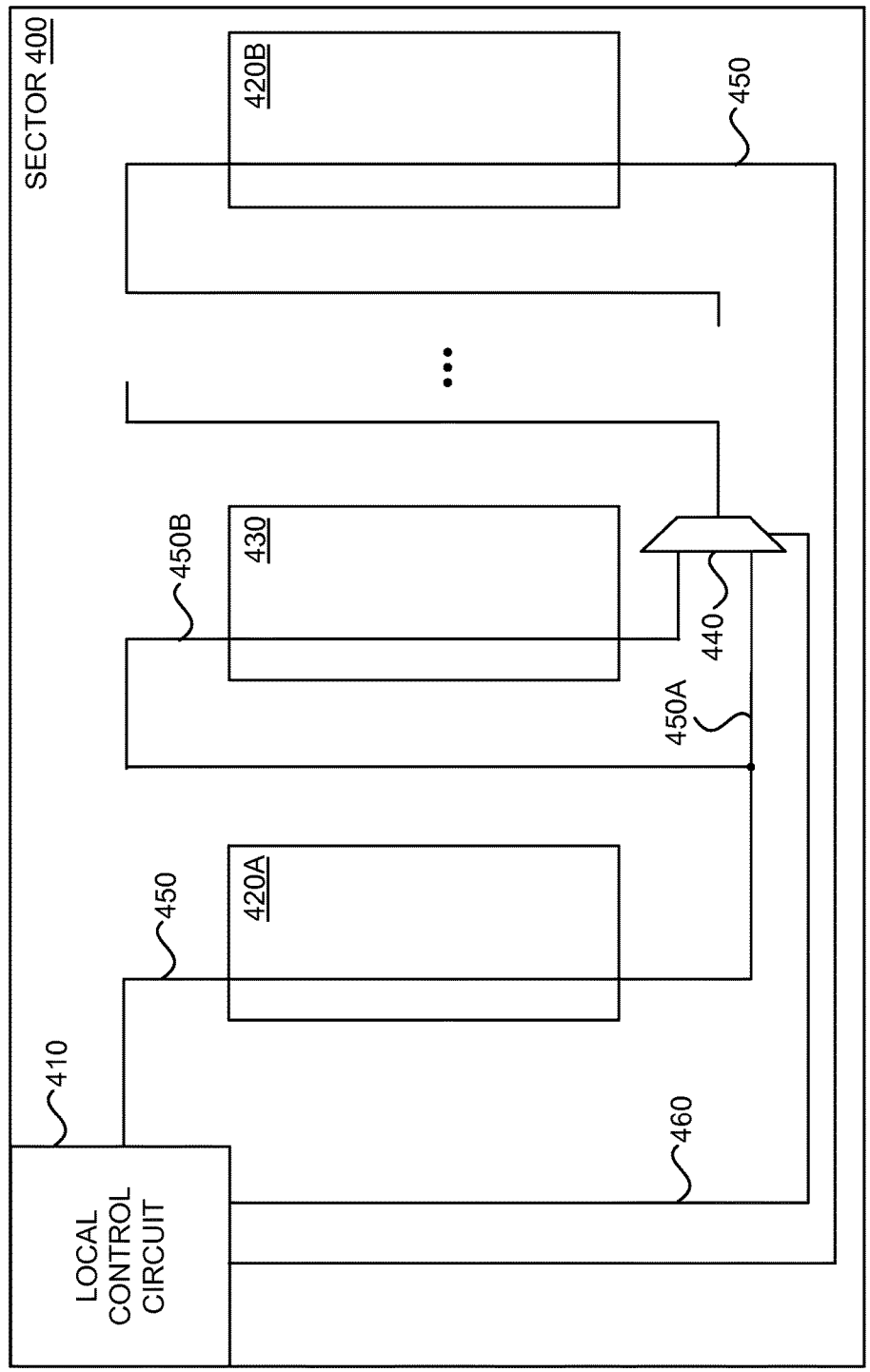
FIG. 4 is a diagram of an illustrative sector with scan chains that are controlled by a local control circuit in accordance with an embodiment.

If desired, a local control circuit (e.g., local control circuit 220 of FIG. 2) may control the scan chain. As an example, the local control circuit may control signals LOAD, UNLOAD, and ENABLE_SCAN. An illustrative embodiment of a sector (e.g., sector 240 of FIG. 2) with a local control circuit that controls a scan chain is shown in FIG. 4. As shown in FIG. 4, a sector 400 may include local control circuit 410, circuit blocks 420 that are of a first type (e.g., LAB 110, DSP 120, or RAM 130 of FIG. 1), and circuit blocks 430 of a second type (e.g., LAB 110, DSP 120, or RAM 130 of FIG. 1) that are different than the circuit blocks 420 of the first type.

Local control circuit 410 may control scan chain 450, which may originate in local control circuit 410, traverse circuit blocks 420A, 430, . . . , and 420B before terminating at local control circuit 410. Scan chain 450 includes portions 450A-450B. Scan chain 450 includes scan storage circuits, such as scan storage circuits 340 and 345. In some embodiments, scan chain 450 includes numerous scan storage circuits. If desired, sector 400 may include more than one scan chain. Each scan chain in sector 400 may originate and terminate in local control circuit 410, and local control circuit 410 may individually control each scan chain in sector 400.

As shown in FIG. 4, local control circuit 410 may control the scan chain 450 using connection 460 and multiplexer

440. For example, local control circuit 410 may direct multiplexer circuit 440 to select the signal on scan chain portion 450A from circuit block 420A at its first multiplexing input, thereby bypassing the scan chain portion 450B from circuit block 430 at its second multiplexing input.

Alternatively, local control circuit 410 may cause multiplexer 440 to select the signal on scan chain portion 450B from circuit block 430. For example, consider the scenario in which sector 400 is operated in hardware test mode. In this scenario, the goal may be to test the operability of all storage circuits in sector 400. In hardware test mode, local control circuit 410 may direct multiplexer 440 to select the signal on scan chain portion 450B at its second multiplexing input.

As another example, consider the scenario in which sector 400 is operated in hardware emulation or prototyping mode, and a user wants to probe the signals stored in circuit blocks 420 using scan chain 450, but not the signals stored in circuit blocks 430. In this scenario, local control circuit 410 may direct multiplexer 440 to select the signal on scan chain portion 450A at its first multiplexing input, bypassing the scan chain portion 450B from circuit block 430.

If desired, local control circuit 410 may be coupled to a global control circuit (e.g., as shown for local control circuit 220 of FIG. 2 that is coupled to global control circuit 210 over network 230). Local control circuit 410 may include filtering capabilities. The filtering capabilities may, for example, allow local control circuit 410 to monitor a subset of storage circuits in one or more of circuit blocks 420 and 430 during a first time period, and to monitor another subset of storage circuits in one or more of circuit blocks 420 and 430 during a second time period.

In embodiments in which local control circuit 410 includes a processor, the processor in local control circuit 410 may perform filtering of captured data using software. As an example, local control circuit 410 may remove sets of state according to user software code running on the processor. As another example, local control circuit 410 may orchestrate a snapshot of data from user storage circuits and perform diagnostic tests to determine whether the snapshot of the data should be abandoned or retained. Local control circuit 410 may, for example, abandon a snapshot once a circuit being tested is determined to be error free.

If desired, local control circuit 410 may individually retrieve data stored in one or more storage circuits, data stored in one or more storage circuits that are located in one or more circuit blocks, or data stored in one or more storage circuits that are coupled to one or more scan chains in sector 400. Local control circuit 410 may retrieve data stored in one or more storage circuits located in an adaptive logic module (ALM) in sector 400, data stored in one or more storage circuits located in a logic array block (LAB) in sector 400, data stored in one or more storage circuits located in a memory element in sector 400, and/or data stored in one or more storage circuits located in a digital signal processor (DSP) block in sector 400. An adaptive logic module (ALM) includes combinatorial logic such as a look-up table. Local control circuit 410 may buffer and/or process the retrieved data. Local control circuit 410 may provide the retrieved data to global control circuit 210 via network 230. Global control circuit 210 may package the retrieved data and transmit the packaged data externally via user interface 250.

When operating an integrated circuit in hardware emulation or prototyping mode, the design-under-test (DUT) circuit that is implemented on the integrated circuit may be encapsulated by wrapper circuitry. An embodiment of an illustrative integrated circuit with a DUT and wrapper circuitry is shown in FIG. 5.

Figure 5:
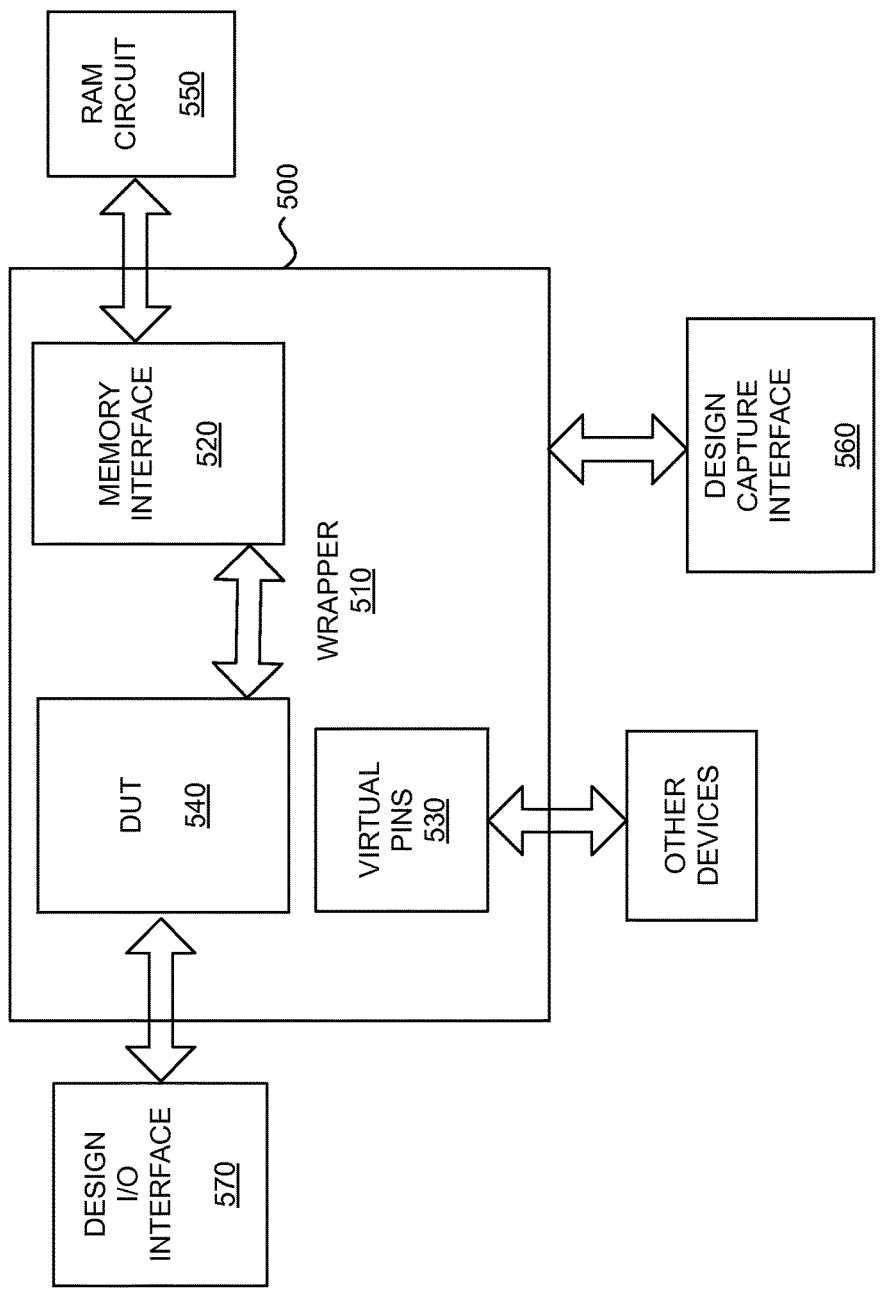
FIG. 5 is a diagram of an illustrative configurable integrated circuit used for hardware emulation in accordance with an embodiment.

As shown in FIG. 5, integrated circuit 500 may include DUT circuit 540, memory interface 520, virtual pins 530, and wrapper circuitry 510. If desired, integrated circuit 500 may be a configurable integrated circuit such as programmable integrated circuit 100 of FIG. 1. In this case, integrated circuit 500 may receive the design implementation as a configuration file and configure integrated circuit 500 by programming programmable memory elements accordingly.

As an example, consider the scenario in which a design implementation is partly implemented by DUT 540, but the design implementation includes a memory that is bigger than the storage provided by integrated circuit 500. In this scenario, integrated circuit 500 may use memory interface 520 to connect DUT 540 to an off-chip storage circuit (e.g., a RAM circuit 550). The off-chip storage circuit emulates the memory in the design implementation as if the memory were included in integrated circuit 500. In this way, a fast off-chip storage circuit (e.g., a DRAM device operating at 500 MHz) may emulate a memory that is part of the design implementation of DUT 540 and that operates at a low frequency (e.g., an SRAM circuit operating at 10 MHz), when integrated circuit 500 does not include sufficient on-chip storage circuits to implement the entire memory.

A user may interact with DUT 540 through the design capture interface 560 and wrapper 510. For example, the user may perform a read-back operation or a write-back operation of a portion or of all the signals stored in the storage circuits of DUT 540 (e.g., using global control circuit 210, communication network 230, local control circuit 220, and scan chains in sectors 240 of FIG. 2). In some embodiments, the user may initiate a read-back operation at regular time intervals and/or when a trigger condition is met. If desired, the user may perform a read-back operation after each triggering event of a clock signal or after a predetermined number of triggering events of a clock signal, just to name a few possibilities.

During operation in hardware emulation mode, DUT 540 may receive input signals (e.g., from a test bench) and generate output signals in response to receiving the input signals. Design I/O interface 570 may provide these input signals to DUT 540 and receive the output signals from DUT 540.

Figure 6:
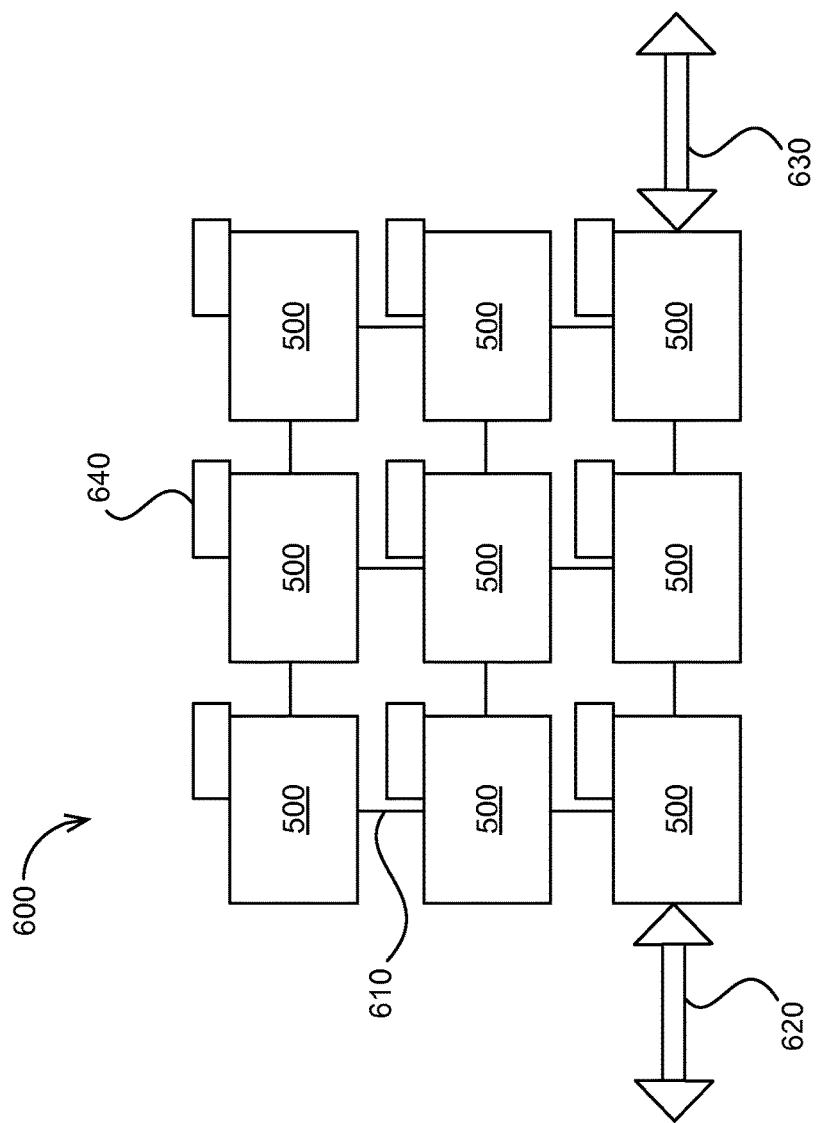
FIG. 6 is a diagram of an illustrative system with multiple interconnected configurable integrated circuits of FIG. 5 in accordance with an embodiment.

In certain embodiments, a design may be implemented across multiple integrated circuits 500 (i.e., the design may be partitioned into multiple portions with each portion being implemented by an instance of DUT 540 on one of the multiple integrated circuits 500). For this purpose, multiple integrated circuits 500 may be arranged on a printed circuit board (PCB) to generate a system 600 as shown in FIG. 6. If desired, multiple PCBs may be interconnected (e.g., arranged in a rack and connected through a back-plane) to create even bigger systems (not shown).

In the scenario in which the design is implemented across multiple integrated circuits 500, virtual pins 530 may time-multiplex multiple signals and send these signals from DUT 540 to another portion of the design that is implemented as a DUT instantiation in a neighboring integrated circuit 500 using, for example, serial interface circuitry such as low-voltage differential signaling (LVDS) or high-speed serial interface (HSSI) transceivers, just to name a few interconnect interfaces.

Interconnects 610 may convey the signals from one integrated circuit 500 to another integrated circuit 500. For example, interconnects 610 may couple a HSSI transmitter on one integrated circuit 500 to a HSSI receiver on another integrated circuit 500. As another example, interconnects 610 may couple an LVDS interface on one integrated circuit 500 to an LVDS interface on another integrated circuit 500.

If desired, external RAM circuits 640 may be associated with some or all integrated circuits 500. Each of the external RAM circuits 640 may be implemented in system 600 next to an associated one of integrated circuits 500. Alternatively, each of the external RAM circuits 640 may be implemented in the same package as the associated integrated circuit 500 (e.g., as a 2.5 dimensional (2.5D) circuit on a silicon interposer or as a 3 dimensional (3D) circuit with stacked dies which may be bonded to the same substrate or connected by through-silicon via (TSV) connections).

Figure 7:
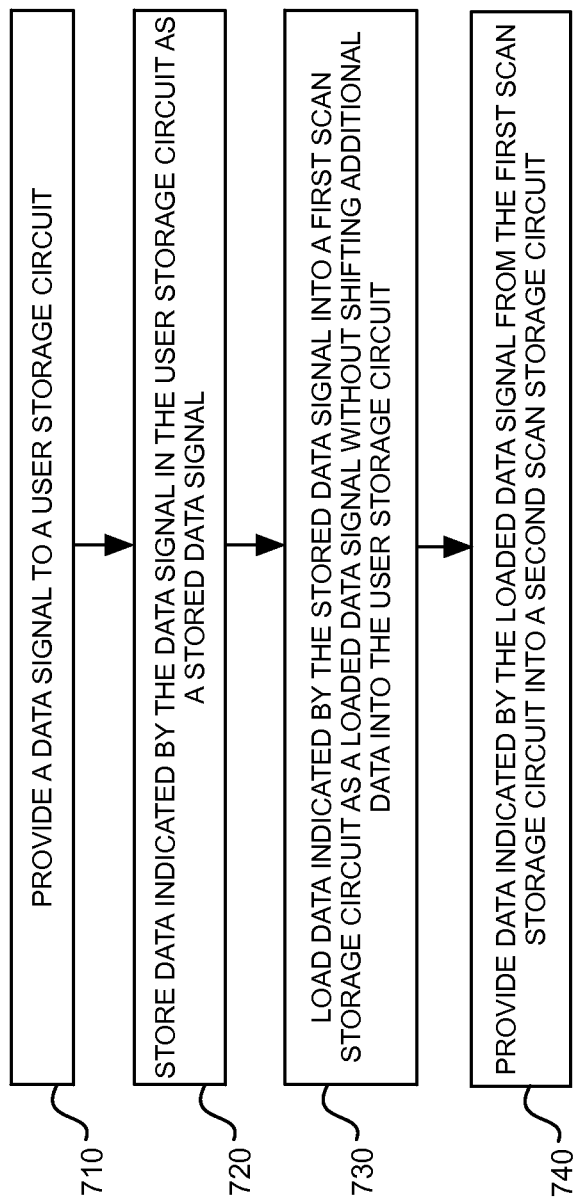
FIG. 7 is a flow chart showing illustrative operations for capturing the state of a user storage circuit using a scan chain in accordance with an embodiment.

Design I/O interface 620 may provide input signals to integrated circuits 500 in system 600 and receive output signals that were generated by the respective DUT instances in integrated circuits 500 in response to receiving the input signals. Users may interface with the respective DUT instances in integrated circuits 500 using design capture interface 630. For example, users may perform a read-back operation on integrated circuits 500 to retrieve the signals stored in storage circuits on integrated circuits 500, thereby capturing the state of a user storage circuit. FIG. 7 is a flow chart showing illustrative operations that a hardware emulation framework may perform for capturing the state of a user storage circuit using a scan chain in accordance with an embodiment.

During operation 710, the hardware emulation framework may provide a data signal to a user storage circuit. For example, user storage circuit 320A of FIG. 3 may receive data signal DATA-IN_A through multiplexer 310. During operation 720, the user storage circuit may store the data indicated by the data signal as a stored data signal.

During operation 730, the read-back operation may load the data indicated by the stored data signal into a first scan storage circuit as a loaded data signal without shifting additional data into the user storage circuit. For example, the read-back operation may de-assert signals ENABLE_USER and ENABLE_SCAN of FIG. 3 to halt clock signals C1 and C2, respectively. Signal LOAD may be set to '1' to cause multiplexer 330 to select the signal from user storage circuit 320A. Signal ENABLE_SCAN may be asserted to allow one triggering event of clock signal C2. Thus, clock signal C2 may trigger scan storage circuit 340 to store the data from user storage circuit 320A.

During operation 740, the read-back operation may provide data indicated by the loaded data signal from the first scan storage circuit into a second scan storage circuit. For example, signal LOAD in FIG. 3 may be switched from '1' to '0', such that multiplexers 330 and 335 select signals from other scan storage circuits on the scan chain. Signal ENABLE_SCAN may be asserted, which may start clock signal C2. As a result, scan storage circuits 340 and 345 may shift the data indicated by the loaded data signals out of the scan chain in signal SCAN-OUT at successive triggering events of clock signal C2.

Figure 8:
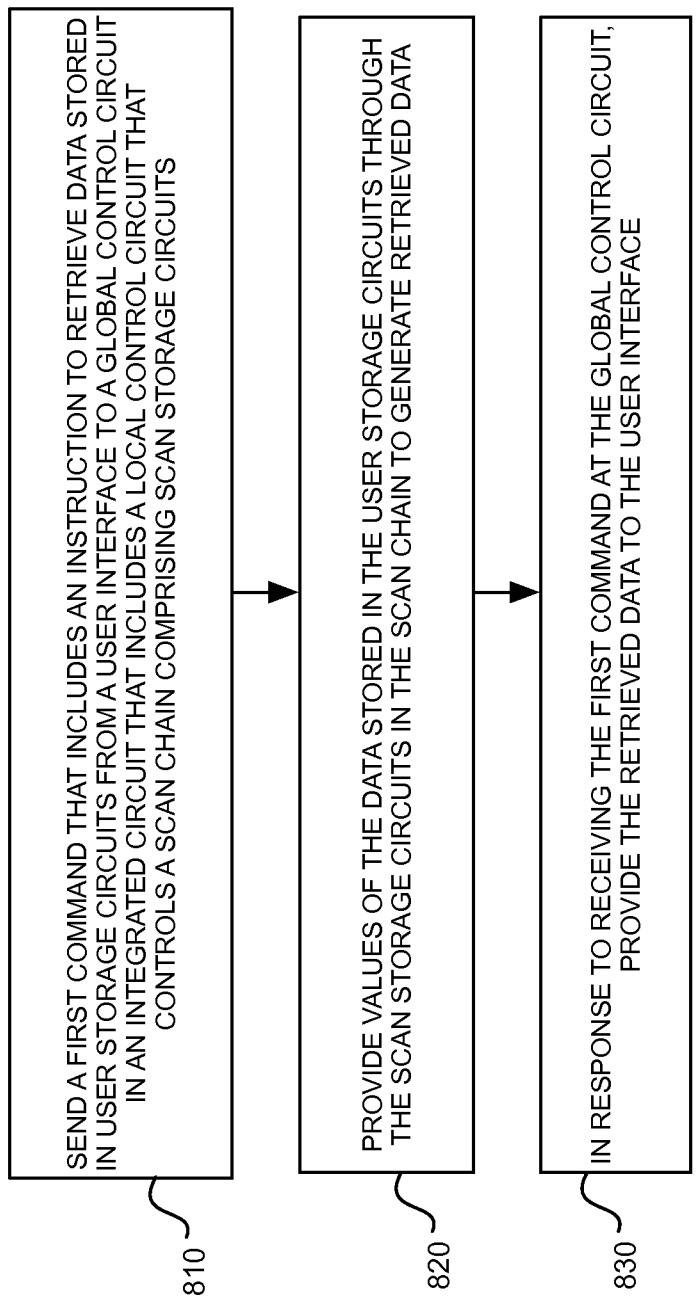
FIG. 8 is a flow chart showing illustrative operations for operating an integrated circuit with the goal of retrieving data stored in user storage circuits through a scan chain in accordance with an embodiment.

FIG. 8 is a flow chart showing illustrative operations for operating an integrated circuit (e.g., using user interface 250 of FIG. 2) with the goal of retrieving data stored in user storage circuits through a scan chain having scan storage circuits in accordance with an embodiment.

During operation 810, a first command that includes an instruction to retrieve data stored in user storage circuits is sent from a user interface (e.g., user interface 250 of FIG. 2) to a global control circuit (e.g., global control circuit 210 of FIG. 2) in the integrated circuit.

During operation 820, values of the data stored in the user storage circuits are provided from scan storage circuits in a scan chain (e.g., scan storage circuits 340 and 345 of FIG. 3 or scan chain 450 of FIG. 4) in the integrated circuit to a local control circuit (e.g., local control circuit 220 of FIG. 2 or local control circuit 410 of FIG. 4) in the integrated circuit as retrieved data. Operation 820 may be performed during the read-back operation.

In response to receiving the first command at the global control circuit, the global control circuit may provide the retrieved data to the user interface during operation 830.

The methods and apparatuses described herein may be incorporated into any suitable electronic device or system of electronic devices. For example, the methods and apparatuses may be incorporated into numerous types of devices such as microprocessors or other integrated circuits (ICs). Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), graphics processing units (GPUs), just to name a few.

The integrated circuits described herein may be part of a data processing system that includes one or more of the following components; a processor; memory; I/O circuitry; and peripheral devices. The integrated circuits can be used in a wide variety of applications, such as computer networking, data networking, instrumentation, video processing, digital signal processing, or any suitable other application such as hardware emulation or prototyping where the advantage of performing read-back and/or write-back operations is desirable.

Although the method operations were described in a specific order, it should be understood that other operations may be performed in between described operations, described operations may be adjusted so that they occur at slightly different times or described operations may be distributed in a system that allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. An integrated circuit, comprising:
   first and second user storage circuits that store first and second user signals in response to a first clock signal;
   a scan chain comprising first and second scan storage circuits;
   a first multiplexer to provide the first user signal from the first user storage circuit to the first scan storage circuit in a first mode, wherein the first scan storage circuit stores the first user signal in response to a second clock signal that is different from the first clock signal, and wherein the first multiplexer provides a first scan signal to the first scan storage circuit in a second mode; and
   a second multiplexer to provide the second user signal from the second user storage circuit to the second scan storage circuit in the first mode, wherein the second multiplexer provides a second scan signal from the first scan storage circuit to the second scan storage circuit in the second mode, and wherein the second scan storage circuit stores the second scan signal in response to the second clock signal.

2. The integrated circuit of claim 1, wherein the first and the second scan signals are provided through the scan chain in the second mode while the first clock signal provided to the first and the second user storage circuits is maintained in a constant logic state, and wherein a triggering event of the first clock signal is generated in the first mode to cause the first and the second user storage circuits to update the first and second user signals based on respective first and second input signals.

3. The integrated circuit of claim 1, wherein the first and the second multiplexers operate in the second mode to generate a snapshot of the first and the second user signals stored in the first and the second user storage circuits without causing the first and the second user storage circuits to change the first and the second user signals.

4. The integrated circuit of claim 1, further comprising:
a clock distribution network coupled to the first and second user storage circuits, wherein the clock distribution network carries the first clock signal with a predetermined clock frequency; and
an enable circuit coupled between the clock distribution network and the first and second user storage circuits, wherein the enable circuit receives an enable signal that gates the first clock signal.

5. The integrated circuit of claim 4, further comprising:
an additional clock distribution network coupled to the first and second scan storage circuits, wherein the additional clock distribution network carries the second clock signal with an additional predetermined clock frequency that is different than the predetermined clock frequency; and
an additional enable circuit coupled between the additional clock distribution network and the first and second scan storage circuits, wherein the additional enable circuit receives an additional enable signal that gates the second clock signal.

6. The integrated circuit of claim 4, further comprising:
a plurality of sectors of logic circuits, wherein the scan chain and the clock distribution network are entirely contained within a first sector of the plurality of sectors.

7. The integrated circuit of claim 6, wherein the first sector further comprises:
a local control circuit that is coupled to the scan chain and the clock distribution network, wherein the local control circuit controls the scan chain and the clock distribution network.

8. The integrated circuit of claim 7, further comprising:
a global control circuit; and
a communication network coupled between the global control circuit and the local control circuit, wherein the communication network conveys commands from the global control circuit to the local control circuit.

9. The integrated circuit of claim 1, further comprising:
a third multiplexer to provide a first data signal to the first user storage circuit in a third mode, wherein the third multiplexer provides a third scan signal from the first scan storage circuit to the first user storage circuit in a fourth mode.

10. The integrated circuit of claim 9, further comprising:
a fourth multiplexer to provide a second data signal to the second user storage circuit in the third mode, wherein the fourth multiplexer provides a fourth scan signal from the second scan storage circuit to the second user storage circuit in the fourth mode.

11. A method, comprising:
providing a data signal to a user storage circuit;
storing data indicated by the data signal in the user storage circuit as a stored data signal in response to a user clock signal;
loading data indicated by the stored data signal into a first scan storage circuit as a loaded data signal in response to a scan clock signal without shifting additional data into the user storage circuit, wherein the scan clock signal is different from the user clock signal; and
providing data indicated by the loaded data signal from the first scan storage circuit to a second scan storage circuit in response to the scan clock signal.

12. The method of claim 11, wherein loading the data indicated by the stored data signal comprises:
providing the data indicated by the stored data signal as a selected data signal using a multiplexer circuit; and
storing data indicated by the selected data signal in the first scan storage circuit.

13. The method of claim 12, wherein loading the data indicated by the stored data signal further comprises:
halting the user clock signal that clocks the user storage circuit with a user clock enable circuit before storing the data indicated by the selected data signal in the first scan storage circuit.

14. The method of claim 11, wherein providing the data indicated by the loaded data signal from the first scan storage circuit to the second scan storage circuit further comprises:
providing a value of a scan-in signal from a scan-in port to the first scan storage circuit with a multiplexer circuit;
enabling the scan clock signal with a scan clock enable circuit to clock the first and the second scan storage circuits, wherein the first and the second scan storage circuits are coupled in a scan chain; and
enabling the user clock signal with a user clock enable circuit to clock the user storage circuit.

15. The method of claim 11, further comprising:
storing a value of a predetermined signal in the first scan storage circuit as a stored predetermined signal; and
loading a value of the stored predetermined signal in the user storage circuit.

16. The method of claim 15, wherein loading the value of the stored predetermined signal in the user storage circuit comprises:
providing the value of the stored predetermined signal from the first scan storage circuit to the user storage circuit using a multiplexer circuit; and
storing the value of the stored predetermined signal received from the multiplexer circuit in the user storage circuit.

17. The method of claim 16, wherein loading the value of the stored predetermined signal in the user storage circuit further comprises:
halting the scan clock signal with a scan clock enable circuit before storing the value of the stored predetermined signal received from the multiplexer circuit in the user storage circuit.

18. The method of claim 17, further comprising:
halting the user clock signal with a user clock enable circuit;
selecting an additional data signal with the multiplexer circuit; and
enabling the user clock signal with the user clock enable circuit.

19. An integrated circuit, comprising:
a plurality of sectors, wherein each of first and second sectors of the plurality of sectors comprises:
a first circuit block that includes a first scan storage circuit, a first multiplexer circuit, and a user storage circuit;
a second circuit block that includes a second scan storage circuit, wherein the first and the second scan storage circuits are coupled in a scan chain, wherein data is shifted into the scan chain and stored in the first and the second scan storage circuits in response to a first clock signal, wherein the first multiplexer circuit selects a scan signal from the first scan storage circuit as a selected signal, wherein the user storage circuit stores the selected signal in response to a second clock signal, and wherein the second clock signal is deferent from the first clock signal; and
a local control circuit that controls the scan chain.

20. The integrated circuit of claim 19, wherein the first sector further comprises:
an additional scan chain, wherein the local control circuit in the first sector controls the scan chain and the additional scan chain independently of each other.

21. The integrated circuit of claim 19, wherein each of the first and the second sectors further comprises:
a second multiplexer circuit that receives a first scan signal from the first scan storage circuit and a second scan signal from the second scan storage circuit, wherein the second multiplexer circuit selects the second scan signal in a test mode, wherein the second multiplexer circuit selects the first scan signal in an emulation mode to bypass the second scan storage circuit, and wherein a signal selected by the second multiplexer circuit is provided to the local control circuit in the respective one of the first and the second sectors.

22. The integrated circuit of claim 19, wherein the local control circuit in the first sector retrieves a set of data from the scan chain in the first sector.

23. The integrated circuit of claim 22, wherein the local control circuit in the first sector filters the set of data from the scan chain to extract a signal that was stored in the first scan storage circuit.

24. The integrated circuit of claim 22, further comprising:
a network that connects the first sector of the plurality of sectors to the second sector of the plurality of sectors; and
a global control circuit that is coupled to the network and that controls the local control circuit in each of the first and the second sectors.

25. The integrated circuit of claim 24, wherein the local control circuit in the second sector retrieves an additional set of data from the scan chain in the second sector, and wherein the global control circuit directs the local control circuits in the first and the second sectors to interleave elements from the set of data with elements from the additional set of data for transmission over the network.

26. The integrated circuit of claim 24, further comprising:
an input pin;
an output pin; and
interface circuitry coupled between the input and the output pins and the global control circuit, wherein the global control circuit receives a signal over the interface circuitry from the input pin, and wherein the global control circuit transmits a signal over the interface circuitry to the output pin.

27. A method for operating an integrated circuit, the method comprising:
receiving a first command at a global control circuit in the integrated circuit, wherein the first command includes an instruction to retrieve data stored in user storage circuits, wherein the data is stored in the user storage circuits in response to a first clock signal;
storing values of the data in scan storage circuits in a scan chain in response to a second clock signal, wherein the second clock signal is different from the first clock signal;
providing the values of the data from the scan storage circuits in the scan chain in the integrated circuit to a local control circuit in the integrated circuit as retrieved data; and
in response to receiving the first command at the global control circuit, sending the retrieved data from the local control circuit over a network to the global control circuit.

28. The method of claim 27, further comprising:
generating a second command to retrieve the data stored in the user storage circuits using the global control circuit;
sending the second command from the global control circuit over the network to the local control circuit; and
in response to receiving the second command at the local control circuit, loading the values of the data stored in the user storage circuits to the scan chain.

29. The method of claim 28, further comprising:
capturing state information from the scan chain at the local control circuit; and
filtering the captured state information based on the second command using the local control circuit to generate a subset of the captured state information.

30. The method of claim 27, wherein the scan storage circuits in the scan chain are scan registers.

31. The method of claim 28, further comprising:
packaging the retrieved data at the global control circuit to generate packaged data; and
streaming the packaged data from the global control circuit.

* * * * *